(12) United States Patent
Kang et al.

(10) Patent No.: US 9,389,451 B2
(45) Date of Patent: Jul. 12, 2016

(54) PHOTOSENSITIVE RESIN COMPOSITION, METHOD OF FORMING PATTERN, AND LIQUID CRYSTAL DISPLAY USING THE SAME

(71) Applicant: Samsung Display Co., Ltd., Yongin, Gyeonggi-Do (KR)

(72) Inventors: Hoon Kang, Suwon-si (KR); Jae-Sung Kim, Suwon-si (KR); Jin-Young Choi, Incheon (KR); Koichi Sugitani, Hwaseong-si (KR); Ki-Hyun Cho, Suwon-si (KR); Jin Ho Ju, Seoul (KR); Byung-Uk Kim, Hwaseong-si (KR); Joo-Pyo Yun, Hwaseong-si (KR); Hyoc-Min Youn, Hwaseong-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/173,634

(22) Filed: Feb. 5, 2014

(65) Prior Publication Data
US 2014/0327866 A1     Nov. 6, 2014

(30) Foreign Application Priority Data

May 2, 2013   (KR) .................. 10-2013-0049593

(51) Int. Cl.
| | | |
|---|---|---|
| C09K 19/00 | (2006.01) |
| G02F 1/1333 | (2006.01) |
| G03F 7/004 | (2006.01) |

(52) U.S. Cl.
CPC ........ *G02F 1/133345* (2013.01); *G03F 7/0045* (2013.01); *Y10T 428/10* (2015.01); *Y10T 428/1059* (2015.01); *Y10T 428/1077* (2015.01)

(58) Field of Classification Search
CPC ..... G03F 7/038; G03F 7/0045; G03F 7/0392; G02F 1/133345; G02F 1/1335; Y10T 428/10; Y10T 428/1059; Y10T 428/1077; Y10T 428/1082
USPC ......... 428/1.1, 1.5, 1.53, 1.54, 1.55; 349/138; 430/281.1, 286.1, 287.1, 321, 322; 522/25
See application file for complete search history.

(56) References Cited

U.S. PATENT DOCUMENTS 5,565,304 A     10/1996  Honda
5,880,169 A      3/1999  Osawa et al.
(Continued)

FOREIGN PATENT DOCUMENTS

EP    1 036 789 B1    3/2003
JP    08-006252 A     1/1996
(Continued)

OTHER PUBLICATIONS

"Sulfonium based photoacid generator" from BASF, Retrived from Internet, Apr. 2015.*
(Continued)

*Primary Examiner* — Ruiyun Zhang
(74) *Attorney, Agent, or Firm* — Knobbe Martens Olson & Bear LLP

(57) ABSTRACT

A photosensitive resin composition is disclosed. The disclosed photosensitive resin composition includes an acryl-based copolymer formed by copolymerizing i) unsaturated carboxylic acid, unsaturated carboxylic acid anhydride, or a mixture thereof, and ii) an olefin-based unsaturated compound or a mixture thereof, a dissolution inhibitor in which a phenolic hydroxyl group is protected by an acid-degradable acetal or ketal group, a photoacid generator, and a solvent.

9 Claims, 2 Drawing Sheets

(56) References Cited

U.S. PATENT DOCUMENTS

| | | | |
|---|---|---|---|
| 5,981,140 A * | 11/1999 | Sato et al. | 430/270.1 |
| 6,060,212 A | 5/2000 | McCulloch et al. | |
| 6,303,268 B1 * | 10/2001 | Namba et al. | 430/270.1 |
| 6,440,642 B1 | 8/2002 | Shelnut et al. | |
| 7,157,204 B2 | 1/2007 | Jung et al. | |
| 7,609,357 B2 | 10/2009 | Kim | |
| 7,643,114 B2 | 1/2010 | Lee et al. | |
| 7,760,281 B2 | 7/2010 | Tanabe et al. | |
| 7,935,474 B2 | 5/2011 | Lee et al. | |
| 7,968,275 B2 | 6/2011 | Han et al. | |
| 8,081,286 B2 | 12/2011 | Kim et al. | |
| 2003/0232273 A1 | 12/2003 | Adams et al. | |
| 2010/0233628 A1 | 9/2010 | Akita et al. | |
| 2010/0267177 A1 | 10/2010 | Chen et al. | |
| 2011/0019139 A1 | 1/2011 | Cui et al. | |
| 2011/0058133 A1 | 3/2011 | Ishigaki et al. | |
| 2011/0244397 A1 | 10/2011 | Kim et al. | |
| 2012/0009795 A1 | 1/2012 | Endou et al. | |

FOREIGN PATENT DOCUMENTS

| | | |
|---|---|---|
| JP | 10-087733 A | 4/1998 |
| JP | 3587981 B2 | 8/2004 |
| JP | 4399192 B2 | 10/2009 |
| KR | 10-0322234 B1 | 1/2002 |
| KR | 10-0361588 B1 | 11/2002 |
| KR | 10-0435517 B1 | 6/2004 |
| KR | 10-2009-0019621 A | 2/2009 |
| KR | 10-0964773 B1 | 6/2010 |
| KR | 10-2012-0043643 A | 5/2012 |
| KR | 10-2012-0106086 A | 9/2012 |

OTHER PUBLICATIONS

International Search Report dated Jul. 25, 2014 for International Patent Application No. PCT/KR2014/003167, corresponds to Korean Patent Application No. KR 10-2013-0049593, which is the foreign priority for captioned U.S. Appl. No. 14/173,634.

Ciba® Irgacure® 184, Photoinitiator, © Ciba Specialty Chemicals Inc., Edition: Apr. 9, 2001, Basle, pp. 1-3.

Ciba® Irgacure® 369, Photoinitiator, © Ciba Specialty Chemicals Inc., Edition: Apr. 9, 2001, Basle, pp. 1-3.

Ciba® Irgacure® OXE01, Photoinitiator, © Ciba Specialty Chemicals Inc., Edition: Nov. 25, 2002, Basle, pp. 1-3.

* cited by examiner

PHOTOSENSITIVE RESIN COMPOSITION, METHOD OF FORMING PATTERN, AND LIQUID CRYSTAL DISPLAY USING THE SAME

CROSS-REFERENCE TO RELATED APPLICATIONS

This application claims priority to and the benefit of Korean Patent Application No. 10-2013-0049593 filed in the Korean Intellectual Property Office on May 2, 2013, the entire contents of which are incorporated herein by reference.

BACKGROUND

1. Field

The disclosed technology relates to a photosensitive resin composition, a method of forming a pattern, and a liquid crystal display using the same.

2. Description of the Related Technology

A flat panel display is extensively used in electronics, and there are different types of flat panel displays including a liquid crystal display (LCD) and an organic light emitting display (OLED).

A photoprocess may be used to pattern a layer, and a photoresist material can be used in the photoprocess. Alternatively, a layer may be directly formed by exposing and developing the photoresist material.

An insulating layer, a column spacer, an overcoat layer, and a color filter layer may be formed using the photoresist material. The resolution, adherence, residual layer thickness, and other similar properties depend on the composition of the photosensitive resin that is used as the photoresist material.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

The disclosed technology provides a photosensitive resin composition with excellent performance such as sensitivity, transmittance, and chemical resistance. The disclosed technology also provides a method of forming a pattern using the same.

Further, the disclosed technology provides a liquid crystal display having substantially low or no reddish or greenish defects when an organic layer of the display is formed.

Some aspects of the disclosed technology provides a photosensitive resin composition including: an acryl-based copolymer formed by copolymerizing i) unsaturated carboxylic acid, unsaturated carboxylic acid anhydride, or a mixture thereof, and ii) an olefin-based unsaturated compound or a mixture thereof, a dissolution inhibitor in which a phenolic hydroxyl group is protected by an acid-degradable acetal or ketal group, a photoacid generator, and a solvent.

In some embodiments, the dissolution inhibitor wherein the phenolic hydroxyl group is protected with an acid-degradable acetal group or ketal group may be represented by the following Chemical Formula 1.

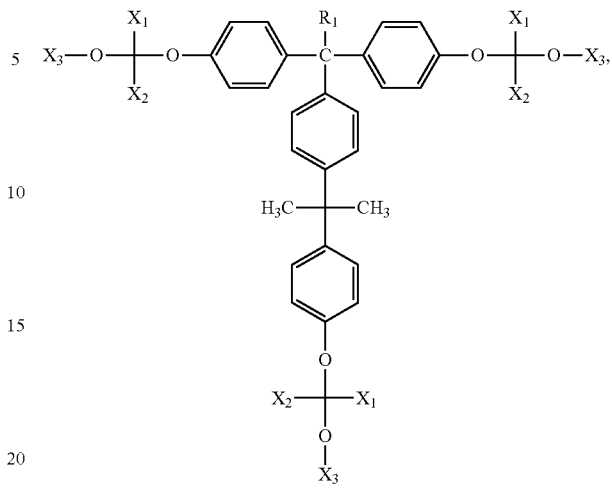

Chemical Formula 1 wherein
$R_1$ is a hydroxyl group or a methyl group;
$X_1$ and $X_2$ are each independently hydrogen, an alkyl group or an aryl group;
$X_3$ is an alkyl group or an aryl group;
or $X_1$ or $X_2$ is connected to $X_3$ to form cyclic ether.

In some embodiments, the dissolution inhibitor is 4,4'-[1-[4-[1-[4-hydroxyphenyl]-1-methylethyl]phenyl]ethylidene]bisphenol or 4,4'-(hydroxy(4-(2-(4-hydroxyphenyl)propan-2-yl)phenyl)methylene)diphenol wherein the phenolic hydroxyl group is protected with an acid-degradable acetal group or ketal group at a ratio of 90% or higher.

In some embodiments, the photoacid generator may be represented by the following Chemical Formula 2.

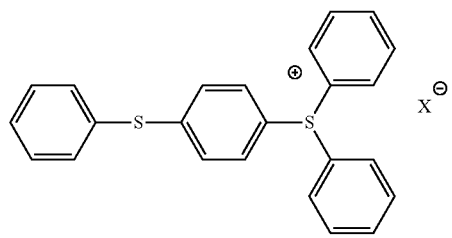

Chemical Formula 2 wherein X is $SbF_6$.

In some embodiments, the amount of the acryl-based copolymer may be 100 parts by weight, wherein the acryl-based copolymer is obtained by copolymerizing i) about 5 parts by weight to about 40 parts by weight of the unsaturated carboxylic acid, the unsaturated carboxylic acid anhydride, or the mixture thereof and ii) about 60 parts by weight to about 95 parts by weight of the olefin-based unsaturated compound or the mixture thereof and removing a unreacted monomer, the amount of the dissolution inhibitor may be about 5 parts by weight to about 50 parts by weight, the amount of the sulfonium salt photoacid generator may be about 0.01 parts by weight to about 10 parts by weight, and the amount of the solvent may be about 10 parts by weight to about 90 parts by weight.

The unsaturated carboxylic acid, the unsaturated carboxylic acid anhydride, or the mixture thereof may include at least one selected from the group including acrylic acid, methacrylic acid, maleic acid, fumaric acid, citraconic acid, mesaconic acid, itaconic acid, anhydrides thereof, and any combinations thereof.

The olefin-based unsaturated compound may include at least one selected from the group including methyl methacrylate, ethyl methacrylate, n-butyl methacrylate, sec-butyl methacrylate, tert-butyl methacrylate, methyl acrylate, isopropyl acrylate, cyclohexyl methacrylate, 2-methylcyclohexyl methacrylate, dicyclopentenyl acrylate, dicyclopentanyl acrylate, dicyclopentenyl methacrylate, dicyclopentanyl methacrylate, 1-adamantyl acrylate, 1-adamantyl methacrylate, dicyclopentanyloxyethyl methacrylate, isoboronyl methacrylate, cyclohexyl acrylate, 2-methylcyclohexyl acrylate, dicyclopentanyloxyethyl acrylate, isoboronyl acrylate, phenyl methacrylate, phenyl acrylate, benzyl acrylate, 2-hydroxyethyl methacrylate, styrene, σ-methyl styrene, m-methyl styrene, p-methyl styrene, vinyltoluene, p-methoxy styrene, 1,3-butadiene, isoprene and 2,3-dimethyl 1,3-butadiene, acrylic acid glycidyl, methacrylic acid glycidyl, α-ethylacrylic acid glycidyl, α-n-propylacrylic acid glycidyl, α-n-butylacrylic acid glycidyl, acrylic acid-β-methylglycidyl, methacrylic acid-β-methylglycidyl, acrylic acid-β-ethylglycidyl, methacrylic acid-β-ethylglycidyl, acrylic acid-3,4-epoxybutyl, methacrylic acid-3,4-epoxybutyl, acrylic acid-6,7-epoxyheptyl, methacrylic acid-6,7-epoxyheptyl, α-ethylacrylic acid-6,7-epoxyheptyl, o-vinylbenzylglycidylether, m-vinylbenzylglycidylether, p-vinylbenzylglycidylether, methacrylic acid 3,4-epoxy cyclohexyl, or any combinations thereof.

A polystyrene-converted weight average molecular weight of the acryl-based copolymer may be about 3,000 to about 30,000.

The dissolution inhibitor is 4,4'-[1-[4-[1-[4-hydroxyphenyl]-1-methylethyl]phenyl]ethylidene]bisphenol or 4,4'-(hydroxy(4-(2-(4-hydroxyphenyl)propan-2-yl)phenyl)methylene)diphenol wherein the phenolic hydroxyl group is protected with an acid-degradable acetal group or ketal group at a substitution ratio of 90% or higher may be represented by the following Chemical Formula 1

Chemical Formula 1

![Chemical Formula 1 structure]

wherein
$R_1$ is a hydroxyl group or a methyl group;
$X_1$ and $X_2$ are each independently hydrogen, an alkyl group or an aryl group;

$X_3$ is an alkyl group or an aryl group; or
$X_1$ or $X_2$ is connected to $X_3$ to form cyclic ether.

The photoacid generator may include at least one selected from the group including diazonium salt-based, phosphonium salt-based, sulfonium salt-based, imidesulfonate-based, oximesulfonate-based, diazodisulfone-based, disulfone-based, ortho-nitrobenzylsulfonate-based, and halogenated triazine-based compounds.

Another aspect of the disclosed technology provides a liquid crystal display including: an insulating layer formed by using the photosensitive resin composition.

The liquid crystal display may further include a substrate, and a thin film transistor disposed on the substrate, in which the insulating layer may be disposed on the thin film transistor, and a pixel electrode may be disposed on the insulating layer.

The insulating layer may include a contact hole, and one terminal of the thin film transistor and the pixel electrode may be connected through the contact hole.

Yet another aspect of the disclosed technology provides a method of forming a pattern, including: applying a photosensitive resin composition on a substrate, and exposing and developing the photosensitive resin composition, in which the photosensitive resin composition includes an acryl-based copolymer formed by copolymerizing i) unsaturated carboxylic acid, unsaturated carboxylic acid anhydride, or a mixture thereof, and ii) an olefin-based unsaturated compound or a mixture thereof, a dissolution inhibitor in which a phenolic hydroxyl group is protected by an acid-degradable acetal or ketal group, a photoacid generator, and a solvent.

The dissolution inhibitor is 4,4'-[1-[4-[1-[4-hydroxyphenyl]-1-methylethyl]phenyl]ethylidene]bisphenol or 4,4'-(hydroxy(4-(2-(4-hydroxyphenyl)propan-2-yl)phenyl)methylene)diphenol wherein the phenolic hydroxyl group is protected with an acid-degradable acetal group or ketal group and may be represented by the following Chemical Formula 1.

Chemical Formula 1

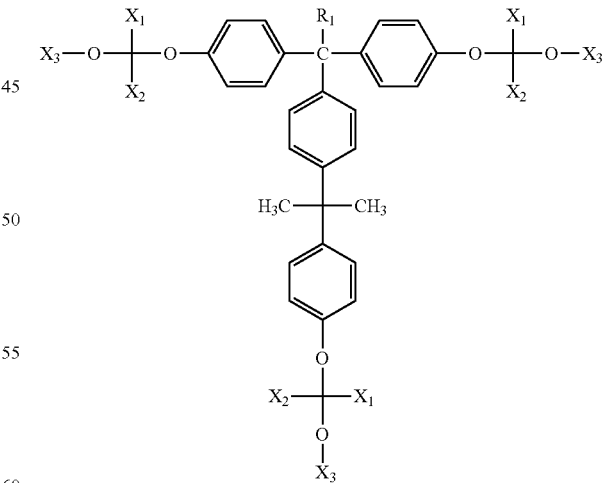

wherein
$R_1$ is a hydroxyl group or a methyl group;
$X_1$ and $X_2$ are each independently hydrogen, an alkyl group or an aryl group;
$X_3$ is an alkyl group or an aryl group; or
$X_1$ or $X_2$ is connected to $X_3$ to form cyclic ether.

The photoacid generator may be represented by the following Chemical Formula 2.

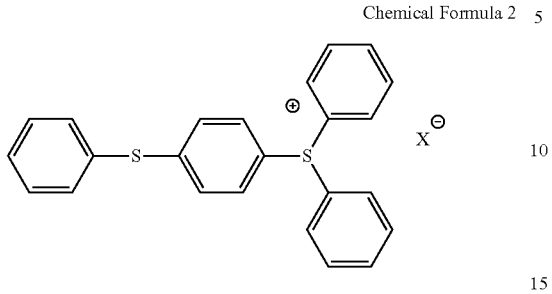

Chemical Formula 2 wherein X is $SbF_6$.

In some embodiments, the amount of the acryl-based copolymer may be 100 parts by weight, wherein the acryl-based copolymer is obtained by copolymerizing i) 5 parts by weight to 40 parts by weight of the unsaturated carboxylic acid, the unsaturated carboxylic acid anhydride, or the mixture thereof and ii) 60 parts by weight to 95 parts by weight of the olefin-based unsaturated compound or the mixture thereof and removing a unreacted monomer, the amount of the dissolution inhibitor may be 5 parts by weight to 50 parts by weight, the amount of the sulfonium salt photoacid generator may be 0.01 parts by weight to 10 parts by weight, and the amount of the solvent may be 10 parts by weight to 90 parts by weight.

According to the exemplary embodiments of the present invention, it is possible to prevent reddish defects or greenish defects by using a novel photosensitive resin composition and form an organic layer having excellent characteristics such as sensitivity, transmittance, and chemical resistance.

DETAILED DESCRIPTION OF CERTAIN INVENTIVE EMBODIMENTS

Figure 1:
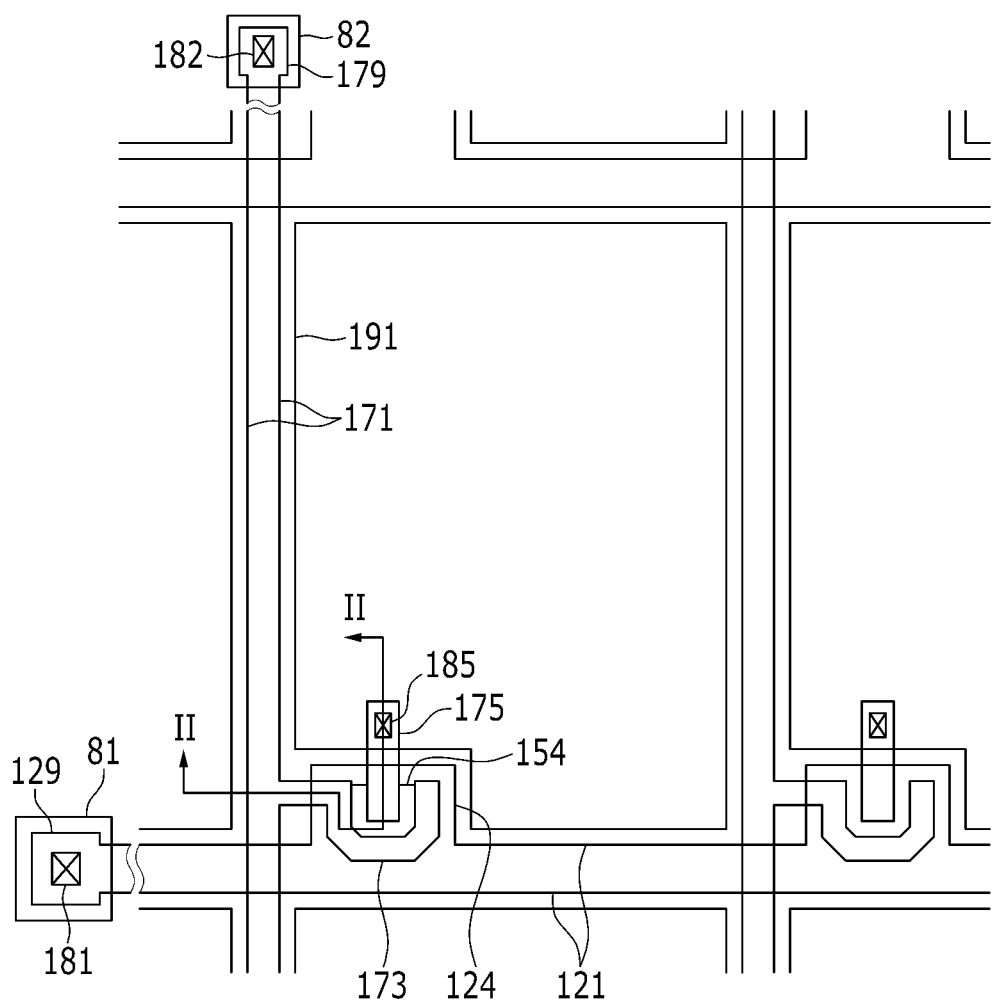
FIG. 1 is a top view illustrating a display device.

Hereinafter, embodiments of the disclosed technology will be described in detail with reference to the accompanying drawings. As those skilled in the art would realize, the described embodiments may be modified in various different ways, all without departing from the spirit or scope of the present invention. On the contrary, embodiments introduced herein are provided to make disclosed contents thorough and complete and sufficiently transfer the spirit of the present invention to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening them may also be present. Like reference numerals designate like elements throughout the specification.

In some embodiments, a photosensitive resin composition includes an acryl-based copolymer formed by copolymerizing i) unsaturated carboxylic acid, unsaturated carboxylic acid anhydride, or a mixture thereof with ii) an olefin-based unsaturated compound or a mixture thereof; a dissolution inhibitor in which a phenolic hydroxyl group is protected by an acid-degradable acetal group or ketal group; a photoacid generator; and a solvent.

In some embodiments, the dissolution inhibitor may be represented by the following Chemical Formula 1.

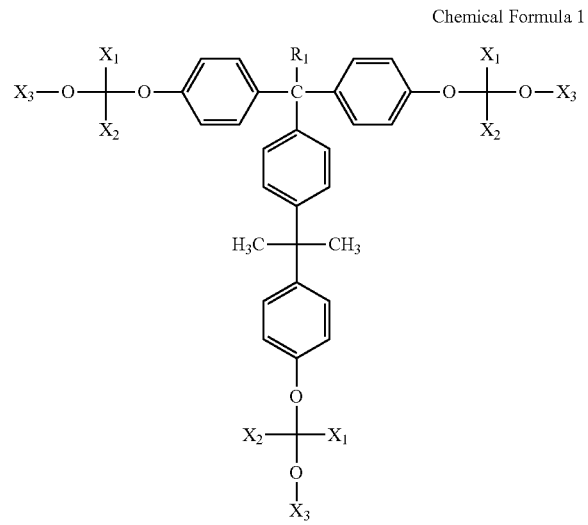

Chemical Formula 1 wherein
$R_1$ is a hydroxyl group or a methyl group;
$X_1$ and $X_2$ are each independently hydrogen, an alkyl group or an aryl group;
$X_3$ is an alkyl group or an aryl group;
or $X_1$ or $X_2$ is connected to $X_3$ to form cyclic ether.

In some embodiments, the cyclic ether can be a tetrahydropyranyl group or a tetrahydrofuranyl group.

In some embodiments, the dissolution inhibitor can be 4,4'-[1-[4-[1-[4-hydroxyphenyl]-1-methylethyl]phenyl]ethylidene]bisphenol or 4,4'-(hydroxy(4-(2-(4-hydroxyphenyl)propan-2-yl)phenyl)methylene)diphenol, wherein the phenolic hydroxyl group in the dissolution may be protected with an acid-degradable acetal or ketal group.

In some embodiments, the phenolic hydroxyl group in the dissolution inhibitor may be protected with an acid-degradable acetal or ketal group. In some embodiments, about 90% or higher of the phenolic hydroxyl group in the dissolution may be protected with an acid-degradable acetal or ketal group. When the protection ratio of the phenolic hydroxyl group with the acetal or ketal group is less than 90%, the residual layer thickness after developing may be reduced due to a lower chemical resistance of the non-exposure region to a developing solution.

In the present exemplary embodiment, the photoacid generator may be represented by the following Chemical Formula 2.

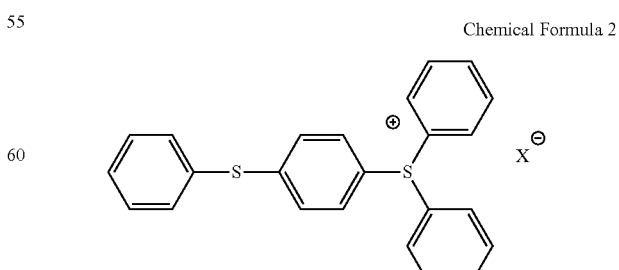

Chemical Formula 2 wherein X is $SbF_6$.

In some embodiments, the acryl-based copolymer is an alkali-soluble resin formed by copolymerizing i) an unsaturated carboxylic acid, an unsaturated carboxylic acid anhydride, or the mixture thereof, with ii) an olefin-based unsaturated compound or a mixture thereof. Further, the acryl-based copolymer may be obtained by radical-reacting i) the unsaturated carboxylic acid, unsaturated carboxylic acid anhydride, or the mixture thereof, and ii) the olefin-based unsaturated compound as monomers in the presence of a solvent and a polymerization initiator; and removing unreacted monomers through precipitation, filtration, and vacuum drying processes.

In some embodiments, any one of the unsaturated carboxylic acid, unsaturated carboxylic acid anhydride, and the mixture thereof may be selected from the group consisting of acrylic acid, methacrylic acid, maleic acid, fumaric acid, citraconic acid, mesaconic acid, itaconic acid, and anhydrides thereof. In some embodiments, it is more preferable to use the acrylic acid, the methacrylic acid, and maleic anhydride due to a better copolymerization reactivity and solubility in an alkali developing solution.

In some embodiments, the unsaturated carboxylic acid, unsaturated carboxylic acid anhydride, or the mixture thereof may be in an amount of about 5 parts by weight to about 40 parts by weight of the total amount of monomers. When the amount is less than 5 parts by weight, the unsaturated carboxylic acid, unsaturated carboxylic acid anhydride, or the mixture thereof may not easily be dissolved in the alkali aqueous solution; When the amount is more than 40 parts by weight, the solubility in the alkali aqueous solution may become too high.

In some embodiments, the olefin-based unsaturated compound may be selected from the group consisting of methyl methacrylate, ethyl methacrylate, n-butyl methacrylate, sec-butyl methacrylate, tert-butyl methacrylate, methyl acrylate, isopropyl acrylate, cyclohexyl methacrylate, 2-methylcyclohexyl methacrylate, dicyclopentenyl acrylate, dicyclopentanyl acrylate, dicyclopentenyl methacrylate, dicyclopentanyl methacrylate, 1-adamantyl acrylate, 1-adamantyl methacrylate, dicyclopentanyloxyethyl methacrylate, isoboronyl methacrylate, cyclohexyl acrylate, 2-methylcyclohexyl acrylate, dicyclopentanyloxyethyl acrylate, isoboronyl acrylate, phenyl methacrylate, phenyl acrylate, benzyl acrylate, 2-hydroxyethyl methacrylate, styrene, σ-methyl styrene, m-methyl styrene, p-methyl styrene, vinyltoluene, p-methoxy styrene, 1,3-butadiene, isoprene and 2,3-dimethyl 1,3-butadiene, acrylic acid glycidyl, methacrylic acid glycidyl, α-ethylacrylic acid glycidyl, α-n-propylacrylic acid glycidyl, α-n-butylacrylic acid glycidyl, acrylic acid-β-methylglycidyl, methacrylic acid-β-methylglycidyl, acrylic acid-β-ethylglycidyl, methacrylic acid-β-ethylglycidyl, acrylic acid-3,4-epoxybutyl, methacrylic acid-3,4-epoxybutyl, acrylic acid-6,7-epoxyheptyl, methacrylic acid-6,7-epoxyheptyl, α-ethylacrylic acid-6,7-epoxyheptyl, o-vinylbenzylglycidylether, m-vinylbenzylglycidylether, p-vinylbenzylglycidylether, and methacrylic acid 3,4-epoxy cyclohexyl.

In some embodiments, it is preferable that the olefin-based unsaturated compound be included in an amount of about 60 parts by weight to about 95 parts by weight of the total amount of monomers When the amount is less than 60 parts by weight, the resolution and heat resistance of the formed layer deteriorate. When the amount is more than about 95 parts by weight, it may become difficult to dissolve the acryl-based copolymer in the alkali developing solution.

In some embodiments, methanol, tetrahydroxyfuran, toluene, dioxane, or the like may be used as solvent to perform the solution polymerization of the aforementioned monomers.

A radical polymerization initiator may be used to perform the solution polymerization of the aforementioned monomers. In some embodiments, 2,2-azobisisobutyronitrile, 2,2-azobis(2,4-dimethylvaleronitrile), 2,2-azobis(4-methoxy 2,4-dimethylvaleronitrile), 1,1-azobis(cyclohexane-1-carbonitrile), dimethyl 2,2'-azobisisobutylate, or the like may be used as a radical polymerization initiator.

In some embodiments, it is preferable that the polystyrene-converted weight average molecular weight (Mw) of the acryl-based copolymer, which is obtained by radical-reacting the aforementioned monomers in the presence of the solvent and the polymerization initiator and removing unreacted monomers through the precipitation, filtering, and vacuum drying processes, can be from about 3,000 to about 30,000. In the case of the organic insulating layer in which the polystyrene-converted weight average molecular weight is less than 3,000, the developing property, a residual layer thickness, and the like properties may deteriorate, and the pattern developing, heat resistance, may be of poor quality. When the organic insulating layer in which the polystyrene-converted weight average molecular weight is more than 30,000, the pattern developing may be of poor quality.

Hereinafter, specific Examples and Comparative Examples of the photosensitive resin composition of the disclosed technology will be described.

Manufacturing of Acryl-Based Copolymer

Example 1-1

10 parts by weight of 2,2'-azobis(2,4-dimethylvaleronitrile), 200 parts by weight of propyleneglycol monomethylether acetate, 20 parts by weight of the methacrylic acid, 25 parts by weight of methacrylic acid glycidyl, 35 parts by weight of hydroxyethyl methacrylate, and 20 parts by weight of styrene were added into a 2 L flask. The flask was equipped with a cooler and an agitator. The mixture was flushed with nitrogen and smoothly agitated. The temperature of the obtained reaction solution was increased to 65° C. and maintained at that temperature for 5 hours to produce the polymer including the acryl-based copolymer. Thereafter, the temperature of the flask was reduced to 18° C. to stop the polymerization. in the reaction mixture was precipitated with 500 parts by weight of normal hexane, and the precipitate was filtered. Propyleneglycolmonomethyl propionate was added to 85 parts by weight of the precipitate so that the precipitate was 45 wt % of the polymer solution. The weight average molecular weight Mw of the obtained acryl-based polymer in the polymer solution was measured by the gel permeation chromatography (GPC).

The weight average molecular weight (Mw) measured by the GPC was 11,000. The measurement was performed using the gel permeation chromatography under the aforementioned condition where KF-801, KF-802, and KF-803 were used as the column, the flow rate was 1 ml/min, tetrahydrofuran (THF) was used as the elution solvent, the column temperature was 40° C., and the detector was the differential refractometer. In this case, the weight average molecular weight (Mw) was the monodispersed polystyrene-converted average molecular weight measured by using the GPC.

Example 1-2

20 parts by weight of the methacrylic acid, 10 parts by weight of methacrylic acid glycidyl, 50 parts by weight of hydroxyethyl methacrylate, and 20 parts by weight of styrene were mixed as in Example 1-1, flushed with nitrogen, and smoothly agitated. The temperature of the reaction solution was increased to 65° C. and=maintained at that temperature for 5 hours to produce the polymer solution including the acryl-based copolymer. Thereafter, the same process as Example 1-1 was performed to obtain the acryl copolymer having a weight average molecular weight of 11,000.

Example 1-3

20 parts by weight of the methacrylic acid, 10 parts by weight of methacrylic acid glycidyl, 50 parts by weight of hydroxyethyl methacrylate, and 20 parts by weight of styrene were mixed was in Example 1-1, flushed with nitrogen, and smoothly agitated. The temperature of the reaction solution was increased to 65° C. and maintained at that temperature for 5 hours to make the polymer solution including the acryl-based copolymer. Thereafter, the same process as in Example 1-1 was performed to obtain the acryl copolymer with a weight average molecular weight of 22,000.

Synthesis of Dissolution Inhibitor

Example 2-1

After 200 parts by weight of acetone, 100 parts by weight of the phenolic hydroxyl group represented by Chemical Formula 1, 1 part by weight of the acid, and 0.5 parts by weight of amine were added to the 2 L flask. The flask was equipped with a cooling tube and an agitator. 60 parts by weight of the ethylvinylether monomer was slowly dripped into the flask and reacted for 1 hour after dripping. After the reaction for 1 hour, the reaction mixture was cooled to room temperature, fractional purification was then performed three times with ultra-pure water. After that, vacuum distillation was performed to make the dissolution inhibitor in which the phenolic hydroxyl group is protected with the acetal monomer at the ratio of 90%.

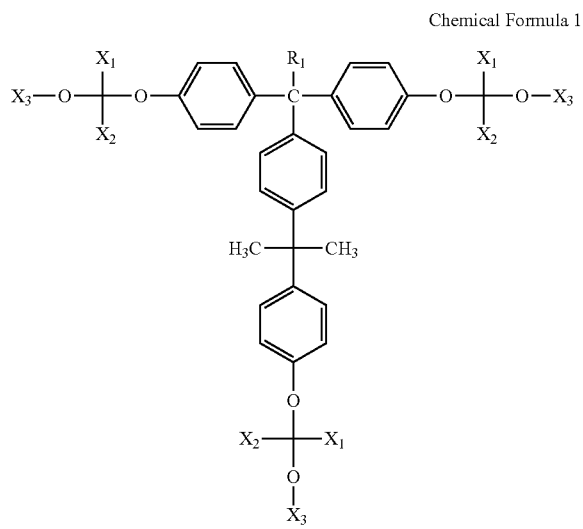

Chemical Formula 1

Manufacturing of Chemically Amplified Positive Photosensitive Resin Composition

Examples 3-1 to 3-12

100 parts by weight of the polymer solution including the acryl-based copolymer made in Examples 1-1 to 1-3, 20 to 30 parts by weight of the dissolution inhibitor made in Example 2-1, and 1 part by weight or 3 parts by weight of the photoacid generator represented by the following Chemical Formula 2 were mixed to make the photosensitive resin compositions of Examples 3-1 to 3-12. Diethyleneglycol dimethylether was dissolved in the mixture and filtered by the millipore filter having a size of 0.2 um to make the chemically amplified positive photosensitive resin coating solution.

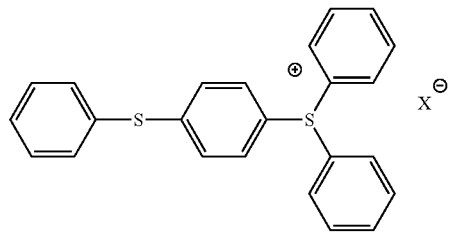

Chemical Formula 2

Herein, in Chemical Formula 2, X is SbF6.

EXAMPLE TABLE

|  | Acryl copolymer | Dissolution inhibitor | Photoacid generator | Solvent |
| --- | --- | --- | --- | --- |
| Example 3-1 | Example 1-1 100 parts by weight | 20 parts by weight | 1 parts by weight | 300 parts by weight |
| Example 3-2 |  |  | 3 parts by weight | 300 parts by weight |
| Example 3-3 | Example 1-2 100 parts by weight | 20 parts by weight | 1 parts by weight | 300 parts by weight |
| Example 3-4 |  |  | 3 parts by weight | 300 parts by weight |
| Example 3-5 | Example 1-3 100 parts by weight | 20 parts by weight | 1 parts by weight | 300 parts by weight |
| Example 3-6 |  |  | 3 parts by weight | 300 parts by weight |
| Example 3-7 | Example 1-1 100 parts by weight | 30 parts by weight | 1 parts by weight | 300 parts by weight |
| Example 3-8 |  |  | 3 parts by weight | 300 parts by weight |
| Example 3-9 | Example 1-2 100 parts by weight | 30 parts by weight | 1 parts by weight | 300 parts by weight |
| Example 3-10 |  |  | 3 parts by weight | 300 parts by weight |
| Example 3-11 | Example 1-3 100 parts by weight | 30 parts by weight | 1 parts by weight | 300 parts by weight |
| Example 3-12 |  |  | 3 parts by weight | 300 parts by weight |

Comparative Example 1

Manufacturing of Positive Photosensitive Resin Composition 100 parts by weight of the polymer solution including the acryl-based copolymer made in Example 1-1 and 30 parts by weight of 1,2-quinonediazide 5-sulfonic acid ester compound were mixed to make the photosensitive resin composition. Diethyleneglycol dimethylether was added and dissolved in the mixture, and filtered by the millipore filter having the size of 0.2 um to produce the positive photosensitive resin coating solution.

Comparative Example 2

Manufacturing of Positive Photosensitive Resin Composition

The positive photosensitive resin coating solution was made by the same method as in Comparative Example 1, except that 100 parts by weight of the polymer solution including the acryl-based copolymer made in Example 1-2 was used.

Comparative Example 3

Manufacturing of Positive Photosensitive Resin Composition

The positive photosensitive resin coating solution was made by the same method as in Comparative Example 1, except that 100 parts by weight of the polymer solution including the acryl-based copolymer made in Example 1-3 was used.

The physical properties of the positive photosensitive resin coating solutions made in Examples 3-1 to 3-12 and Comparative Examples 1 to 3 were evaluated by the following method, and results thereof are described in the following [Table 1].

A) Sensitivity—The photosensitive resin solutions made in Examples 3-1 to 3-12 and Comparative Examples 1 to 3 were spin-coated on the glass substrate, and then pre-baked on the hot plate at 100° C. for 2 mins to form the layer.

Ultraviolet rays having the intensity of 15 mW/cm$^2$ at 365 nm were used to radiate the layer through a mask with a predetermined pattern. Thereafter, after the layer was developed in an aqueous solution of 2.38 parts by weight of tetramethylammonium hydroxide at 25° C. for 75 sec, washing was performed using ultra-pure water for 1 min.

After that, in the case of Comparative Examples 1 to 3, ultraviolet rays having the intensity of 15 mW/cm$^2$ at 365 nm were used to radiate the developed pattern for 34 sec to perform the decolorization process.

Examples 3-1 to 3-12 and Comparative Examples 1 to 3 in which the decolorization process was finished were heated in the oven at 230° C. for 30 mins for curing, and the pattern layer was thus obtained.

B) Reduction in thickness after developing (residual layer)—When sensitivity of A) was measured, thickness of the lowest portion and the highest portion of the formed pattern layer were measured. In this case, the residual layer thickness was calculated using the difference between the initial coating thickness and the thickness after developing.

C) Flow—When sensitivity of A) was measured, after the formed pattern was heated in the oven at 230° C. for 30 mins, if the angle of the pattern with a thickens of 12 um was between 50° and 40°, the flow was determined to be excellent; if the angle was between 40° and 30°, the flow was determined to be normal; and if the angle was between 30° and 20°, the flow was determined to be poor.

D) Transmittance—When sensitivity of A) was measured, the light absorption spectrum in the visible rays region of the coat layer having a thickness of 2.5 microns after prebake was measured, and light transmittance at 400 nm was measured.

E) Reddish—When the layer was compared to the bare glass, if the colors were the same, the reddish was determined to be excellent, if slight defects were observed, the reddish was determined to be favorable, and if significant defects were observed, the reddish was determined to be poor.

TABLE 1

| | Sensitivity (mJ/cm2) | Reduction in thickness after developing(Å) | Flow | Transmittance (%) | Reddish |
|---|---|---|---|---|---|
| Example 3-1 | 40 | 1,505 | Normal | 95~96 | Excellent |
| Example 3-2 | 30 | 897 | Excellent | 92~93 | Favorable |
| Example 3-3 | 19 | 1,130 | Poor | 95~96 | Excellent |
| Example 3-4 | 10 | 920 | Normal | 92~93 | Favorable |
| Example 3-5 | 31 | 680 | Normal | 95~96 | Excellent |
| Example 3-6 | 16 | 420 | Excellent | 92~93 | Favorable |
| Example 3-7 | 30 | 273 | Poor | 95~96 | Excellent |
| Example 3-8 | 20 | 262 | Normal | 92~93 | Favorable |
| Example 3-9 | 15 | 350 | Poor | 95~96 | Excellent |
| Example 3-10 | 6 | 346 | Normal | 92~93 | Favorable |
| Example 3-11 | 17 | 150 | Poor | 95~96 | Excellent |
| Example 3-12 | 9 | 140 | Excellent | 92~93 | Favorable |
| Comparative Example 1 | 130 | 4,900 | Normal | 89~90 | Poor |
| Comparative Example 2 | 105 | 5,600 | Poor | 89~90 | Poor |
| Comparative Example 3 | 106 | 4,000 | Normal | 89~90 | Poor |

The data in Table 1 confirmed that in the case where the photoacid generator was used in the positive photosensitive resin composition, sensitivity was significantly improved as compared to the positive photosensitive resin compositions using the 1,2-quinonediazide 5-sulfonic acid ester compound of Comparative Example 1 to 3.

Further, as the amount of the dissolution inhibitor was increased, the residual layer of the non-exposure portion after developing was excellent, but deterioration of the flow characteristic was observed. The flow characteristic can be improved through an increase in the amount of the photoacid generator. Even though the transmittance and reddish characteristics are degraded to some extent, it can be confirmed that excellent characteristics are observed as compared to the positive photosensitive resin composition using the quinonediazide 5-sulfonic acid ester compound.

Hereinafter, a display device including an organic layer using the photosensitive resin composition and a method of forming an organic layer pattern will be described with reference to FIGS. 1 and 2.

FIG. 1 is a top view illustrating the display device according to some embodiments. FIG. 2 is a cross-sectional view taken along the cut line II-II in FIG. 1.

Figure 2:
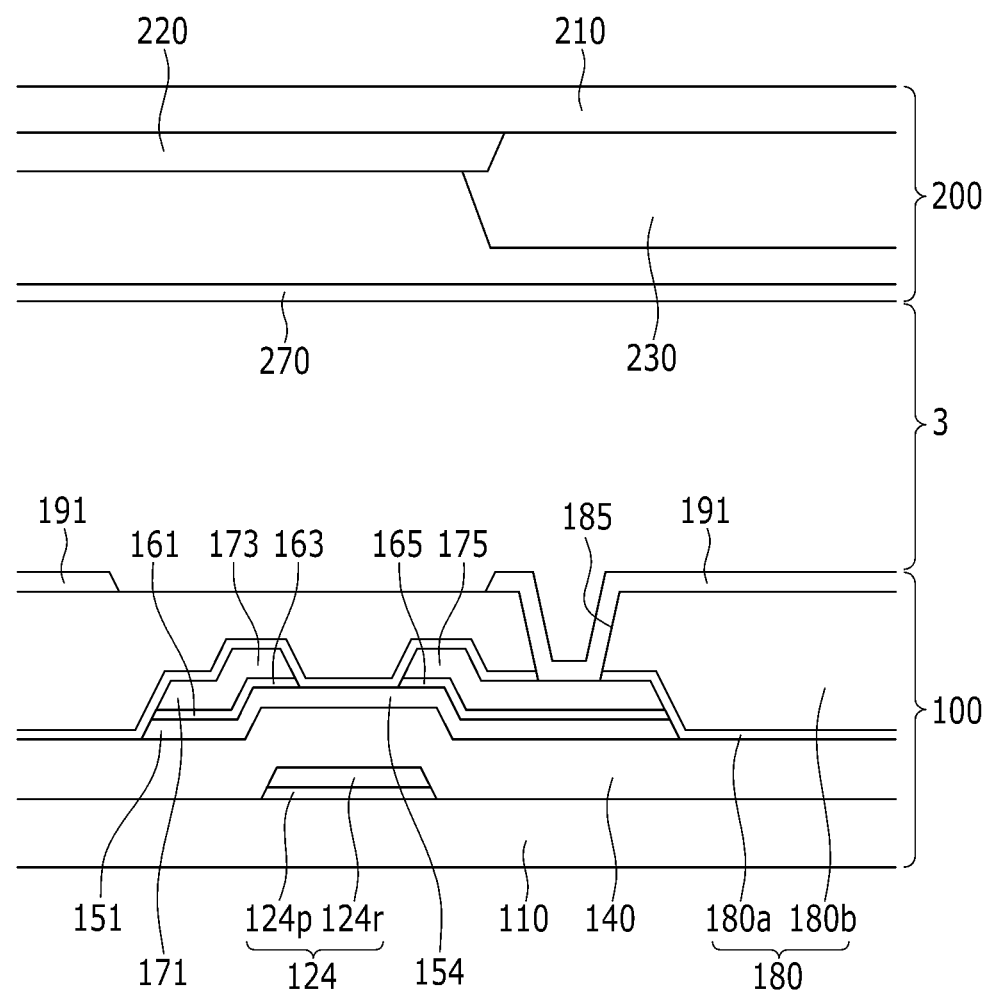
FIG. 2 is a cross-sectional view taken along cut line II-II of FIG. 1.

Referring to FIGS. 1 and 2, the display device includes a lower display panel 100 and an upper display panel 200, and a liquid crystal layer 30 interposed between two display panels 100 and 200.

First, the lower display panel 100 will be described.

A plurality of gate lines 121 is formed on an insulation substrate 110 made of transparent glass or plastic.

The gate line 121 transfers a gate signal and mainly extends in a horizontal direction. Each gate line 121 includes a plurality of gate electrodes 124 that protrudes from the gate line 121 and a wide end portion 129 for connection with another layer or a gate driver (not illustrated). The end portion 129 of the gate line may be formed of a dual-layer of a lower layer 129p and an upper layer 129r.

The gate line 121 and the gate electrode 124 have a dual-layer structure formed of lower layers 121p and 124p and upper layers 121r and 124r. The lower layers 121p and 124p may be formed of any one of titanium, tantalum, molybdenum, and alloys thereof, and the upper layers 121r and 124r may be formed of copper (Cu) or a copper alloy. In some embodiments, it is described that the gate line 121 and the gate electrode 124 have the dual-layer structure, but the gate line 121 and the gate electrode 124 may have a single-layered structure.

In some embodiments, a gate insulating layer 140 made of an insulating material such as silicon nitride or silicon oxide can be formed on the gate line 121.

In some embodiments, a semiconductor layer 151 made of hydrogenated amorphous silicon, polysilicon, or the like can be formed on the gate insulating layer 140. The semiconductor layer 151 mainly extends in a vertical direction, and includes a plurality of projections 154 extending toward the gate electrode 124.

A plurality of ohmic contact stripes 161 and ohmic contact islands 165 are formed on the projection 154 of the semiconductor layer 151. The ohmic contact stripe 161 has a plurality of projections 163, and the projection 163 and the ohmic contact island 165 form a pair and are disposed on the projection 154 of the semiconductor layer 151.

A plurality of data lines 171, a plurality of source electrodes 173 connected to the plurality of data lines 171, and a plurality of drain electrodes 175 facing the source electrodes 173 are formed on the ohmic contacts 161 and 165 and the gate insulating layer 140.

In some embodiments, the data line 171 transports a data signal and mainly extends in a vertical direction to cross the gate line 121. In some embodiments, the source electrode 173 may extend toward the gate electrode 124 to have a U shape as in FIG. 2, but this is just an example, and the source electrode 173 may have the variously modified shapes.

The drain electrode 175 is separated from the data line 171, and extends upwardly from the middle of the U-shaped source electrode 173. The data line 171 includes an end portion 179 having a wide area for connection with another layer or the data driver (not illustrated).

Although not illustrated in the drawings, the data line 171, the source electrode 173, and the drain electrode 175 may have a dual-layer structure of an upper layer and a lower layer. The upper layer may be formed of copper (Cu) or a copper alloy, and the lower layer may be formed of any one of titanium (Ti), tantalum (Ta), molybdenum (Mo), and alloys thereof.

The data line 171, the source electrode 173, and the drain electrode 175 may have a tapered lateral surface.

The ohmic contacts 161, 163, and 165 may exist only between the semiconductors layers 151 and 154 therebeneath and the data line 171 and the drain electrode 175 thereon, and may reduce contact resistance therebetween. Further, the ohmic contacts 161, 163, and 165 may have substantially the same plane pattern as the data line 171, the source electrode 173, and the drain electrode 175.

In the projection 154 of the semiconductor layer 151, there is an exposed portion that is not covered by the data line 171 and the drain electrode 175, such as a portion between the source electrode 173 and drain electrode 175. The semiconductor layer 151 has substantially the same plane pattern as the ohmic contacts 161 and 165 except for the exposed portion of the projection 154.

One gate electrode 124, one source electrode 173, and one drain electrode 175 form one thin film transistor TFT together with the projection 154 of the semiconductor layer 151, and the channel of the thin film transistor is formed in the projection 154 between the source electrode 173 and the drain electrode 175.

A passivation layer 180 including a first passivation layer 180a and a second passivation layer 180b is formed on the data line 171, the drain electrode 175, and the exposed portion of the projection 154 of the semiconductor layer. The first passivation layer 180a may be formed of an inorganic insulating layer such as silicon nitride or silicon oxide, and the second passivation layer 180b may be formed of the aforementioned photosensitive resin composition according to the exemplary embodiment of the present invention. Herein, the first passivation layer 180a may be omitted.

In some embodiments, a contact hole 181 through which an end portion 129 of the gate line 121 is exposed may be formed in the passivation layer 180 and the gate insulating layer 140. Further, a contact hole 182 through which an end portion 179 of the data line 171 is exposed and a contact hole 185 through which an end of the drain electrode 175 is exposed may be formed in the passivation layer 180.

The second passivation layer 180b formed of an organic insulating layer may be patterned through exposure and developing processes and the like. Specifically, the second passivation layer 180b is obtained by applying the photosensitive resin composition described herein on the substrate 110 or the first passivation layer 180a by spin coating, slit and spin coating, slit coating, roll coating, or the like, and removing a solvent by pre-baking to form a coating layer. In this case, it is preferable that the pre-baking be performed at a temperature of 100° C. to 120° C. for 1 to 3 mins.

After that, a predetermined pattern is formed by radiating visible rays, ultraviolet rays, far-ultraviolet rays, electronic beams, X-rays, or the like on the formed coat layer according to a previously prepared pattern, and developing the coating layer in a developing solution to remove an unnecessary portion.

Herein, it is preferable to use an alkali aqueous solution as the developing solution, and specifically, aqueous solutions of inorganic alkalis such as sodium hydroxide, potassium hydroxide, and sodium carbonate, primary amines such as ethylamine and n-propylamine, secondary amines such as diethylamine and n-propylamine, tertiary amines such as trimethylamine, methyldiethylamine, dimethylethylamine, and triethylamine, alcohol amines such as dimethylethanol amine, methyldiethanol amine, and triethanol amine, or quaternary ammonium salts such as tetramethylammonium hydroxide and tetraethylammonium hydroxide may be used. The primary amines may be an organic compound in which only one hydrogen atom of ammonia is substituted with a hydrocarbon group. The secondary amines may have a structure in which two hydrogen atoms of ammonia are substituted with a hydrocarbon group.

In this case, the developing solution is made by dissolving an alkali compound in a concentration of 0.1 to 10 parts by weight, and a water-soluble organic solvent such as methanol and ethanol. A surfactant may be added in the developing solution with an appropriate amount.

Further, after the developing step is performed, washing may be performed by ultra-pure water for 30 to 90 sec to remove an unnecessary portion, drying may be performed to form a pattern, rays such as ultraviolet rays may be used to radiate the formed pattern, and the pattern may be heated using a heating device such as an oven at a temperature of 150° C. to 400° C. for 30 to 90 mins to produce a final pattern.

A pixel electrode 191 and contact assistants 81 and 82 are formed on the passivation layer 180. They may be made of a transparent conductive material such as ITO or IZO, or reflective metal such as aluminum, silver, chromium or an alloy thereof.

The pixel electrode 191 is physically electrically connected to the drain electrode 175 through the contact hole 185, and receives a data voltage from the drain electrode 175.

The contact assistants 81 and 82 are connected through the contact holes 181 and 182 to the end portion 129 of the gate line 121 and the end portion 179 of the data line 171, respectively. The contact assistants 81 and 82 complement adherence between the end portion 129 of the gate line 121 and the end portion 179 of the data line 171 and an external device, and protect the end portions.

Next, the upper display panel 200 will be described.

A light blocking member 220 is formed on an insulation substrate 210 made of transparent glass, plastic, or the like. The light blocking member 220 prevents light leakage between the pixel electrodes 191 and defines an opening region facing the pixel electrode 191.

A plurality of color filters 230 is formed on the insulation substrate 210 and the light blocking member 220. The color filter 230 may be mainly present in the region surrounded by the light blocking member 220, and may longitudinally extend along a column of the pixel electrodes 191. Each color filter 230 may display any one of primary colors such as three primary colors of red, green, and blue colors.

In the present exemplary embodiment, it is described that the light blocking member 220 and the color filter 230 are formed in the upper display panel 200, but at least one of the light blocking member 220 and the color filter 230 may be formed in the lower display panel 100.

An overcoat 250 is formed on the color filter 230 and the light blocking member 220. The overcoat 250 may be made of an (organic) insulator. The overcoat 250 can prevent exposure of the color filter 230 and provides a flat surface. The overcoat 250 may be omitted.

A common electrode 270 is formed on the overcoat 250. The common electrode 270 is made of a transparent conductor such as ITO or IZO, and receives a common voltage Vcom.

The liquid crystal layer 3 interposed between the lower display panel 100 and the upper display panel 200 includes liquid crystal molecules having a negative dielectric anisotropy, and the liquid crystal molecules may be aligned so that long axes thereof are vertical in respect to the surfaces of two display panels 100 and 200 in a state in which there is no electric field.

The pixel electrode 191 and the common electrode 270 form a liquid crystal capacitor together with a portion of the liquid crystal layer 3 therebetween to maintain the applied voltage even after the thin film transistor is turned off.

The pixel electrode 191 may overlap with a storage electrode line (not illustrated) to form a storage capacitor. The voltage storage ability of the liquid crystal capacitor may be increased therethrough.

Although only the organic insulating layer of the liquid crystal display using the photosensitive layer resin composition has been described, the photosensitive layer resin composition described herein can be applied to all display devices using the organic layer, such as an organic light emitting device.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A photosensitive resin composition comprising:
  an acryl-based copolymer formed by copolymerizing i) unsaturated carboxylic acid, unsaturated carboxylic acid anhydride, or a mixture thereof, and ii) an olefin-based unsaturated compound or a mixture thereof;
  a dissolution inhibitor in which a phenolic hydroxyl group is protected with an acid-degradable acetal group or ketal group;
  a photoacid generator represented by the following Chemical Formula 2:

Chemical Formula 2 wherein X is $SbF_6$;
a solvent; and
wherein the dissolution inhibitor is a mixture of 4,4'-[1-[4-[1-[4-hydroxyphenyl]-1-methylethyl]phenyl]ethylidene]bisphenol or 4,4'-(hydroxy(4-(2-(4-hydroxyphenyl)propan-2-yl)phenyl)methylene)diphenol and a compound that is represented by the following Chemical Formula 1, and in the mixture, the phenolic hydroxyl group is substituted with the acid-degradable acetal group or ketal group at a substitution ratio of 90% or more:

Chemical Formula 1 wherein:
$R_1$ is a hydroxyl group;
$X_1$ and $X_2$ are each independently hydrogen, an alkyl group or an aryl group;
$X_3$ is an alkyl group or an aryl group; or
$X_1$ or $X_2$ is connected to X3 to form cyclic ether;
wherein the amount of the acryl-based copolymer is 100 parts by weight;
wherein the amount of the dissolution inhibitor is about 5 parts by weight to about 50 parts by weight based on 100 parts by weight of the acryl-based copolymer;

wherein the amount of the photoacid generator is about 0.01 parts by weight to about 10 parts by weight based on 100 parts by weight of the acryl-based copolymer; and wherein the weight ratio of the photoacid generator to the dissolution inhibitor is in the range of about 1:30 to about 3:20.

2. The photosensitive resin composition of claim 1, wherein:

the acryl-based copolymer is obtained by copolymerizing i) about 5 parts by weight to about 40 parts by weight of the unsaturated carboxylic acid, the unsaturated carboxylic acid anhydride, or the mixture thereof and ii) about 60 parts by weight to about 95 parts by weight of the olefin-based unsaturated compound or the mixture thereof and removing a unreacted monomer.

3. The photosensitive resin composition of claim 1, wherein:

the unsaturated carboxylic acid, the unsaturated carboxylic acid anhydride, or the mixture thereof is selected from the group consisting of acrylic acid, methacrylic acid, maleic acid, fumaric acid, citraconic acid, mesaconic acid, itaconic acid, and anhydrides thereof.

4. The photosensitive resin composition of claim 1, wherein:

the olefin-based unsaturated compound is selected from the group consisting of methyl methacrylate, ethyl methacrylate, n-butyl methacrylate, sec-butyl methacrylate, tert-butyl methacrylate, methyl acrylate, isopropyl acrylate, cyclohexyl methacrylate, 2-methylcyclohexyl methacrylate, dicyclopentenyl acrylate, dicyclopentanyl acrylate, dicyclopentenyl methacrylate, dicyclopentanyl methacrylate, 1-adamantyl acrylate, 1-adamantyl methacrylate, dicyclopentanyloxyethyl methacrylate, isoboronyl methacrylate, cyclohexyl acrylate, 2-methylcyclohexyl acrylate, dicyclopentanyloxyethyl acrylate, isoboronyl acrylate, phenyl methacrylate, phenyl acrylate, benzyl acrylate, 2-hydroxyethyl methacrylate, styrene, σ-methyl styrene, m-methyl styrene, p-methyl styrene, vinyltoluene, p-methoxy styrene, 1,3-butadiene, isoprene and 2,3-dimethyl 1,3-butadiene, acrylic acid glycidyl, methacrylic acid glycidyl, α-ethylacrylic acid glycidyl, α-n-propylacrylic acid glycidyl, α-n-butylacrylic acid glycidyl, acrylic acid-β-methylglycidyl, methacrylic acid-β-methylglycidyl, acrylic acid-β-ethylglycidyl, methacrylic acid-β-ethylglycidyl, acrylic acid-3,4-epoxybutyl, methacrylic acid-3,4-epoxybutyl, acrylic acid-6,7-epoxyheptyl, methacrylic acid-6,7-epoxyheptyl, α-ethylacrylic acid-6,7-epoxyheptyl, o-vinylbenzylglycidylether, m-vinylbenzylglycidylether, p-vinylbenzylglycidylether, methacrylic acid 3,4-epoxy cyclohexyl, and any combinations thereof.

5. The photosensitive resin composition of claim 1, wherein:

a polystyrene-converted weight average molecular weight of the acryl-based copolymer is about 3,000 to about 30,000.

6. The photosensitive resin composition of claim 1, wherein:

the photoacid generator is selected from the group consisting of diazonium salt-based, phosphonium salt-based, sulfonium salt-based, imidesulfonate-based, oximesulfonate-based, diazodisulfone-based, disulfone-based, ortho-nitrobenzylsulfonate-based, halogenated triazine-based compounds, and any combination thereof.

7. A liquid crystal display comprising:

an insulating layer formed by using the photosensitive resin composition of claim 1.

8. The liquid crystal display of claim 7, further comprising:

a substrate; and a thin film transistor positioned on the substrate, wherein an insulating layer is positioned on the thin film transistor, and a pixel electrode is positioned on the insulating layer.

9. The liquid crystal display of claim 8, wherein:

the insulating layer includes a contact hole, and one terminal of the thin film transistor and the pixel electrode are connected through the contact hole.

* * * * *